(12) United States Patent
Izumiya et al.

(10) Patent No.: US 9,935,420 B2
(45) Date of Patent: Apr. 3, 2018

(54) LASER DEVICE, IGNITION SYSTEM, AND INTERNAL COMBUSTION ENGINE

(71) Applicants: Kazuma Izumiya, Miyagi (JP); Tsuyoshi Suzudo, Miyagi (JP); Naoto Jikutani, Miyagi (JP); Yasuhiro Higashi, Miyagi (JP); Kentaroh Hagita, Miyagi (JP); Masayuki Numata, Kanagawa (JP); Nobuyuki Arai, Kanagawa (JP)

(72) Inventors: Kazuma Izumiya, Miyagi (JP); Tsuyoshi Suzudo, Miyagi (JP); Naoto Jikutani, Miyagi (JP); Yasuhiro Higashi, Miyagi (JP); Kentaroh Hagita, Miyagi (JP); Masayuki Numata, Kanagawa (JP); Nobuyuki Arai, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 106 days.

(21) Appl. No.: 14/869,336

(22) Filed: Sep. 29, 2015

(65) Prior Publication Data
US 2016/0094009 A1    Mar. 31, 2016

(30) Foreign Application Priority Data

Sep. 30, 2014   (JP) ................................ 2014-200775
Aug. 26, 2015   (JP) ................................ 2015-166709

(51) Int. Cl.
*H01S 3/113*      (2006.01)
*H01S 3/16*      (2006.01)
(Continued)

(52) U.S. Cl.
CPC .............. *H01S 3/113* (2013.01); *F02P 23/04* (2013.01); *G02B 27/0955* (2013.01);
(Continued)

(58) Field of Classification Search
CPC .... F02P 23/04; H01S 3/113; H01S 3/094053; H01S 3/1643; H01S 3/0602; F02M 27/04
See application file for complete search history.

(56) References Cited

U.S. PATENT DOCUMENTS 8,824,519 B1    9/2014   Seurin et al.
2008/0078347 A1*   4/2008   Klausner ................ F02P 23/04
                                                123/143 B
(Continued)

FOREIGN PATENT DOCUMENTS

DE    10 2014 201 832 A1    8/2014
EP        2 772 996 A2    9/2014
(Continued)

OTHER PUBLICATIONS

Extended European Search Report dated Mar. 4, 2016 in Patent Application No. 15187309.8.

*Primary Examiner* — Long T Tran
(74) *Attorney, Agent, or Firm* — Oblon, McClelland, Maier & Neustadt, L.L.P.

(57) ABSTRACT

A laser device is provided including a surface emitting laser array configured to emit light, an optical system disposed in an optical path of light that is emitted from the surface emitting laser, a laser resonator which the light passed through the optical system enters, where the optical system includes a first optical element configured to collimate the light emitted from the surface emitting laser, and a second optical element configured to collect and condense the light collimated by the first optical element.

15 Claims, 8 Drawing Sheets

(51) Int. Cl.
    *H01S 3/067*    (2006.01)
    *H01S 5/183*    (2006.01)
    *H01S 5/00*    (2006.01)
    *G02B 27/09*    (2006.01)
    *F02P 23/04*    (2006.01)
    *H01S 3/094*    (2006.01)
    *H01S 5/022*    (2006.01)
    *H01S 5/42*    (2006.01)
    *H01S 3/06*    (2006.01)
    *H01S 3/0941*    (2006.01)

(52) U.S. Cl.
    CPC .... *H01S 3/06708* (2013.01); *H01S 3/094049* (2013.01); *H01S 3/094053* (2013.01); *H01S 3/1611* (2013.01); *H01S 3/1643* (2013.01); *H01S 5/005* (2013.01); *H01S 5/02284* (2013.01); *H01S 5/183* (2013.01); *H01S 5/423* (2013.01); *H01S 3/0612* (2013.01); *H01S 3/0627* (2013.01); *H01S 3/09415* (2013.01)

(56) References Cited

U.S. PATENT DOCUMENTS

| | | | |
|---|---|---|---|
| 2011/0150026 A1* | 6/2011 | Tsunekane | F02P 23/04 372/75 |
| 2012/0312267 A1* | 12/2012 | Ridderbusch | F02P 23/04 123/143 B |
| 2013/0112164 A1* | 5/2013 | Morishima | F02P 23/04 123/143 B |
| 2013/0133602 A1* | 5/2013 | Woerner | F02B 17/005 123/143 B |
| 2013/0186362 A1* | 7/2013 | Kanehara | F02P 15/08 123/143 B |
| 2013/0206091 A1* | 8/2013 | Kanehara | F02P 23/04 123/143 B |
| 2013/0208753 A1 | 8/2013 | Van Leeuwen et al. | |
| 2013/0255613 A1 | 10/2013 | Hartke et al. | |
| 2013/0276738 A1 | 10/2013 | Hartke | |
| 2013/0298863 A1* | 11/2013 | Nuebel | F02D 41/22 123/143 B |
| 2014/0216383 A1* | 8/2014 | Nuebel | F01P 3/16 123/143 B |
| 2014/0333995 A1 | 11/2014 | Seurin et al. | |

FOREIGN PATENT DOCUMENTS

| | | |
|---|---|---|
| JP | 9-018423 | 1/1997 |
| JP | 2007-173393 | 7/2007 |
| JP | 2013-545280 | 12/2013 |
| JP | 2015-153862 | 8/2015 |
| WO | WO2012/048965 A1 | 4/2012 |

\* cited by examiner (CONTROL SAMPLE)

(CASE OF LASER DEVICE 200)

(CASE OF LASER DEVICE 400)

(CASE OF LASER DEVICE 200)

(CASE OF LASER DEVICE 400)

FIG. 9

| | LIGHT-EMITTING UNIT AREA | | CORE DIAMETER | PRESENCE OF MICROLENS ARRAY | FIBER OUTPUT | $M^2$ VALUE | | Q-SWITCHED LASER OUTPUT |
|---|---|---|---|---|---|---|---|---|
| | SIZE | SHAPE | | | | | | |
| FIRST EMBODIMENT | 9mm DIAMETER | CIRCULAR | 1.5mm | PRESENT | 180W ◎ | 1200 | ○ | ○ |
| FIRST EMBODIMENT | 9mm DIAMETER | CIRCULAR | 1.0mm | PRESENT | 120W ○ | 1000 | ○ | ○ |
| SECOND EMBODIMENT | 7mm DIAMETER | CIRCULAR | 1.5mm | PRESENT | 120W ○ | 1200 | ○ | ○ |
| FIRST CONTROL SAMPLE | 9mm DIAMETER | CIRCULAR | 1.0mm | ABSENT | 20W × | 1000 | ○ | × |
| SECOND CONTROL SAMPLE | 9mm DIAMETER | CIRCULAR | 1.5mm | ABSENT | 30W × | 1200 | ○ | × |
| THIRD CONTROL SAMPLE | 9mm DIAMETER | CIRCULAR | 2.0mm | ABSENT | 120W ○ | 1800 | × | × |
| FOURTH CONTROL SAMPLE | 9mm DIAMETER | CIRCULAR | 2.5mm | PRESENT | 200W ◎ | 2000 | × | × |
| FIFTH CONTROL SAMPLE | 5mm DIAMETER | CIRCULAR | 1.5mm | PRESENT | 90W × | 1200 | ○ | × |
| SIXTH CONTROL SAMPLE | 5mm SIDE | SQUARE | 0.8mm | PRESENT | 90W × | 800 | ◎ | × |

LASER DEVICE, IGNITION SYSTEM, AND INTERNAL COMBUSTION ENGINE

CROSS-REFERENCE TO RELATED APPLICATIONS

This patent application is based on and claims priority pursuant to 35 U.S.C. §119(a) to Japanese Patent Application Nos. 2014-200775 and 2015-166709, filed on Sep. 30, 2014, and Aug. 26, 2015, respectively, in the Japan Patent Office, the entire disclosure of which is hereby incorporated by reference herein.

BACKGROUND

Technical Field

Embodiments of the present invention relate to a laser device, an ignition system, and an internal combustion engine.

Background Art

Laser devices with laser crystal that resonates by optical pumping are expected to be applied to various kinds of fields including, for example, ignition systems, laser beam machines, and medical equipment.

For example, a laser ignition system that includes a laser device and a pump source with a plurality of surface emitting lasers is known in the art.

Moreover, an ignition system is known where a laser device includes at least one refractive device, the refractive device refracts at least some of pumping light, and the ignition system is integrated into the laser device.

However, it has proven difficult for conventional laser devices to achieve a high pumping efficiency.

SUMMARY

Embodiments of the present invention described herein provide a laser device including a surface emitting laser array configured to emit light, an optical system disposed in an optical path of light that is emitted from the surface emitting laser, a laser resonator which the light passed through the optical system enters, where the optical system includes a first optical element configured to collimate the light emitted from the surface emitting laser, and a second optical element configured to collect and condense the light collimated by the first optical element.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

FIG. 9 is a table of experimental results indicating the output of a Q-switched laser where, for example, the size or shape of a light-emitting unit area, and the core diameter of an optical fiber are varied.

Figure 1:
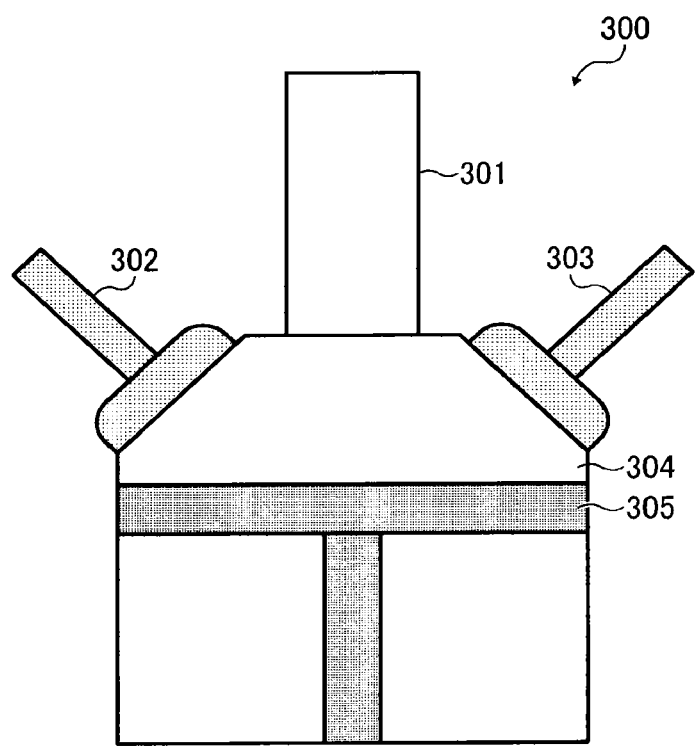
FIG. 1 is a diagram illustrating an outline of an engine according to an embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

<General Outline>

In the following description, an embodiment of the present invention is described with reference to the drawings.

FIG. 1 is a schematic diagram illustrating the principal parts of an engine 300 that serves as an internal combustion engine, according to an embodiment of the present invention.

The engine 300 includes, for example, an ignition system 301, a fuel injector 302, an exhauster 303, a combustion chamber 304, and a piston 305.

The operation of the engine 300 is briefly described.

(1) The fuel injector 302 injects the inflammable fuel-air mixture into the combustion chamber 304 (aspiration).

(2) The piston 305 moves upward and compresses the inflammable fuel-air mixture (compression).

(3) The ignition system 301 emits laser beam into the combustion chamber 304. Accordingly, the fuel is ignited (ignition).

(4) Inflammable gas is generated and the piston 305 moves downward (combustion).

(5) The exhauster 303 exhausts the inflammable gas from the combustion chamber 304 (exhaust).

As described above, a series of processes including aspiration, compression, ignition, combustion, and exhaust are repeated. Then, the piston 305 moves upward and downward according to the changes in the volume of the gas in the combustion chamber 304, and kinetic energy is produced. As fuel, for example, natural gas and gasoline are used.

Note that the above operation of the engine 300 is performed based on the instruction made through an engine controller that is externally provided and is electrically connected to the engine 300.

Figure 2:
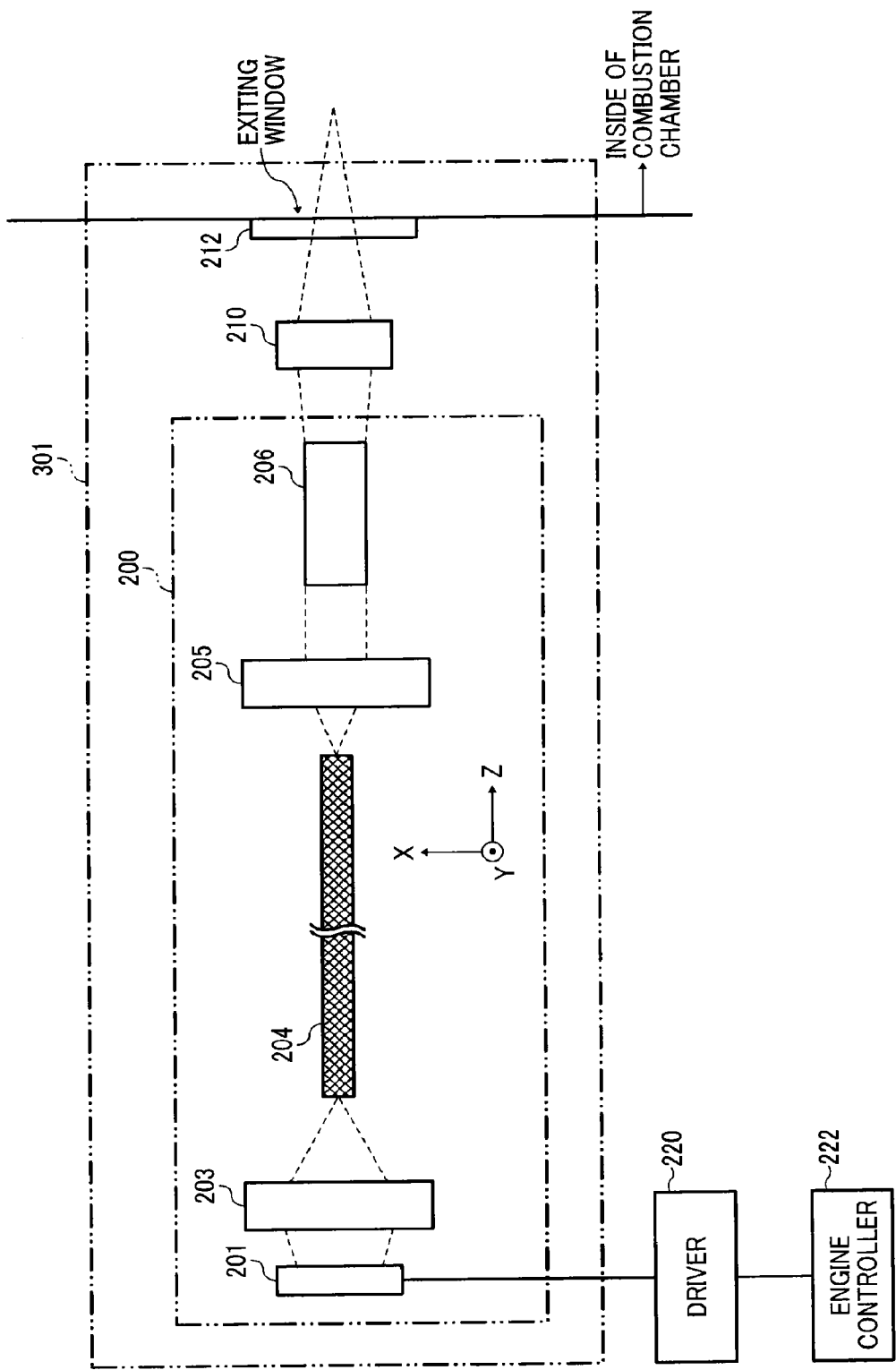
FIG. 2 is a diagram illustrating an ignition system according to an example embodiment of the present invention.

As illustrated in FIG. 2 for example, the ignition system 301 includes a laser device 200, an emission optical system 210, and a protector 212.

The emission optical system 210 collects and condenses the light emitted from the laser device 200. Accordingly, a high energy density can be obtained at a focal point.

The protector 212 is a transparent window facing toward the combustion chamber 304. In the present embodiment, for example, sapphire glass is used as a material of the protector 212.

The laser device 200 includes a surface emitting laser array 201, a first condensing optical system 203, an optical fiber 204, a second condensing optical system 205, and a laser resonator 206. In the XYZ three-dimensional orthogonal coordinate system according to the present embodiment, it is assumed that the direction in which the surface emitting laser array 201 emits light is the +X direction.

The surface emitting laser array 201 is a pump source, and includes a plurality of light-emitting units. Each of the light-emitting units is a vertical cavity-surface emitting laser (VCSEL).

Note that a surface emitting laser array has very little temperature-driven wavelength displacement in the emitting light. Thus, a surface emitting laser array is a light source that is advantageous in pumping Q-switched laser whose characteristics vary widely due to the displacement in pumping wavelength. Accordingly, when a surface emitting laser array is used as a pump source, the temperature control of the environment becomes easier.

The first condensing optical system 203 collects and condenses the light emitted from the surface emitting laser array 201.

The optical fiber 204 is disposed such that the light exited from the first condensing optical system 203 is condensed at the center of the −Z side lateral edge face of the core.

Due to the provision of the optical fiber 204, the surface emitting laser array 201 may be disposed at a position distant from the laser resonator 206. Accordingly, the degree of flexibility in design increases. As the surface emitting laser array 201 can be disposed at a position away from the heat source when the laser device 200 is used for an ignition system, the ranges of choices for a method for cooling the engine 300 can be extended.

The light that has entered the optical fiber 204 propagates through the core, and is exited from the +Z side lateral edge face of the core.

The second condensing optical system 205 is disposed in the optical path of the light emitted from the optical fiber 204, and condenses the light emitted from the optical fiber 204. The light that has been condensed by the second condensing optical system 205 enters the laser resonator 206.

Figure 3:
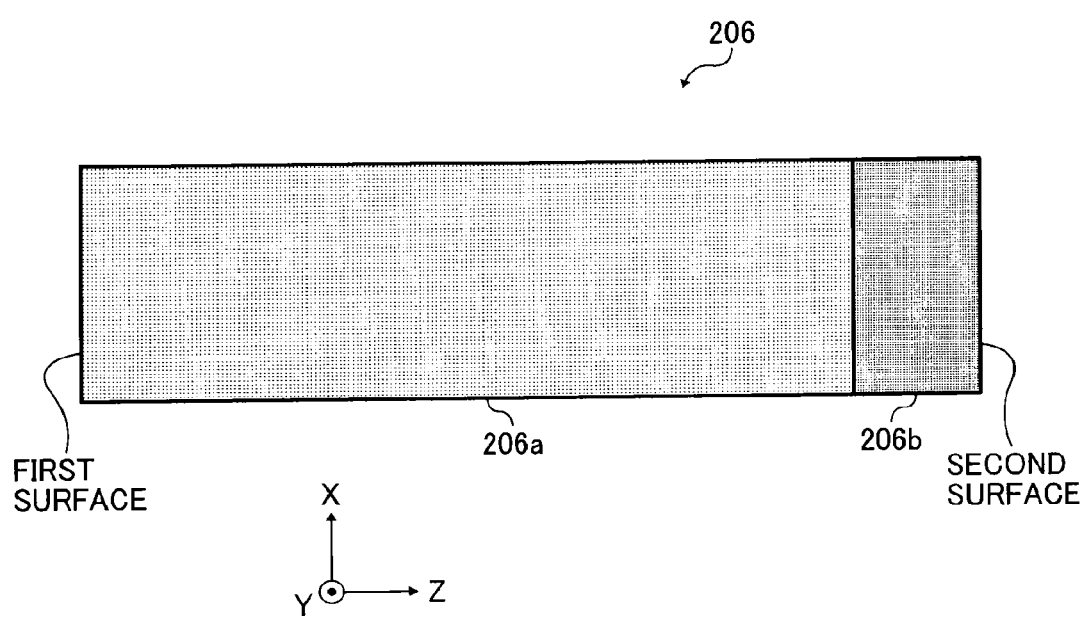
FIG. 3 is a diagram illustrating a laser resonator according to an embodiment of the present invention.

The laser resonator 206 is a Q-switched laser, and as illustrated in FIG. 3 for example, the laser resonator 206 includes a laser medium 206a and a saturable absorber 206b.

The laser medium 206a is a cuboid-shaped neodymium (Nd):yttrium aluminum garnet (YAG) crystal, where the length of the resonator is 8 mm. The saturable absorber 206b is a cuboid-shaped chromium (Cr):YAG crystal, where the length is 2 mm.

In the present embodiment, Nd:YAG crystal and Cr:YAG crystal are bonded together to form a so-called composite crystal. Moreover, the Nd:YAG crystal and the Cr:YAG crystal are both ceramic.

The light that has been condensed by the second condensing optical system 205 enters the laser medium 206a. In other words, the laser medium 206a is optically pumped by the light that has been condensed by the second condensing optical system 205. It is desired that the wavelength of the light that is emitted from the surface emitting laser array 201 be 808 nanometer (nm) where the absorption efficiency is the highest in the YAG crystal. The saturable absorber 206b performs Q-switching.

The surface on the light entering side (−Z side) of the laser medium 206a and the surface on the light exiting side (+Z side) of the saturable absorber 206b are optically polished, and each of these surfaces serves as a mirror. In the following description, for the sake of explanatory convenience, the surface on the light entering side of the laser medium 206a is referred to as a first surface, and the surface on the light exiting side of the saturable absorber 206b is referred to a second surface (see FIG. 3).

On the first and second surfaces, a dielectric layer is coated according to the wavelength of the light that is emitted from the surface emitting laser array 201 and the wavelength of the light that exits from the laser resonator 206.

More specifically, a dielectric layer that indicates sufficient high transmittance to light with the wavelength of 808 nm and indicates sufficiently high reflectance to light with the wavelength of 1064 nm is coated on the first surface. On the second surface, a dielectric layer with selected reflectance indicating a desired threshold to light with the wavelength of 1064 nm is coated.

Accordingly, the light is resonated and amplified inside the laser resonator 206. In the present embodiment, the length of the laser resonator 206 is 10 (=8+2) mm.

As illustrated in FIG. 2, the driver 220 drives the surface emitting laser array 201 based on an instruction from an engine controller 222. More specifically, the driver 220 drives the surface emitting laser array 201 such that the ignition system 301 emits light at the timing when the engine 300 performs ignition. Note that a plurality of light-emitting units of the surface emitting laser array 201 are switched on and switched off at the same time.

When it is not necessary to dispose the surface emitting laser array 201 at a position distant from the laser resonator 206 in the embodiments described above, the provision of the optical fiber 204 may be omitted.

In the present embodiment, cases of an engine (piston engine) where a piston is moved by inflammable gas is used as an internal combustion engine have been described. However, no limitation is intended thereby. For example, a rotary engine, a gas turbine engine, and a jet engine may be used as an internal combustion engine. In other words, any engine may be used as long as it burns fuel to produce inflammable gas.

The ignition system 301 may be used for cogeneration in which exhaust heat is reused to increase the comprehensive energy efficiency. The exhaust heat in cogeneration is used for obtaining motive power, heating energy, or cooling energy.

In the present embodiment, cases in which the ignition system 301 is used for an internal combustion engine have been described. However, no limitation is intended thereby.

In the present embodiment, cases in which the laser device 200 is used for an ignition system have been described. However, no limitation is intended thereby. For example, the laser device 200 may be used for a laser beam machine, a laser peening apparatus, or a terahertz generator.

<Details>

Laser devices with laser crystal that resonates by optical pumping are expected to be applied to various kinds of fields including, for example, ignition systems, laser beam machines, and medical equipment. Q-switched lasers where a saturable absorber is provided at an end of a laser crystal are capable of outputting laser light with a very high peak value, and thus are expected to be applied to technology where high energy density is required.

Note that a vertical-cavity surface-emitting laser (VCSEL) is a semiconductor laser that performs laser oscillation in a direction orthogonal to the substrate. Such a surface emitting laser has very high wavelength stability against temperature, and a higher output power is more easily achieved by building a two-dimensional array. For this reason, surface emitting lasers are expected to be applied to a light source that optically pumps a laser crystal (such a light source may be referred to as a pump source in the following description).

However, when the light that is emitted from a surface emitting laser is directly collected and condensed by a condenser lens, the condensed light has relatively even spatial intensity distribution in a radial direction.

The light that has relatively even spatial intensity distribution has low beam quality, and thus when the condensed light enters the laser crystal, the light the beam diameter widely changes before and after the beam waist. As a result, the laser crystal cannot efficiently be pumped.

Figure 4:
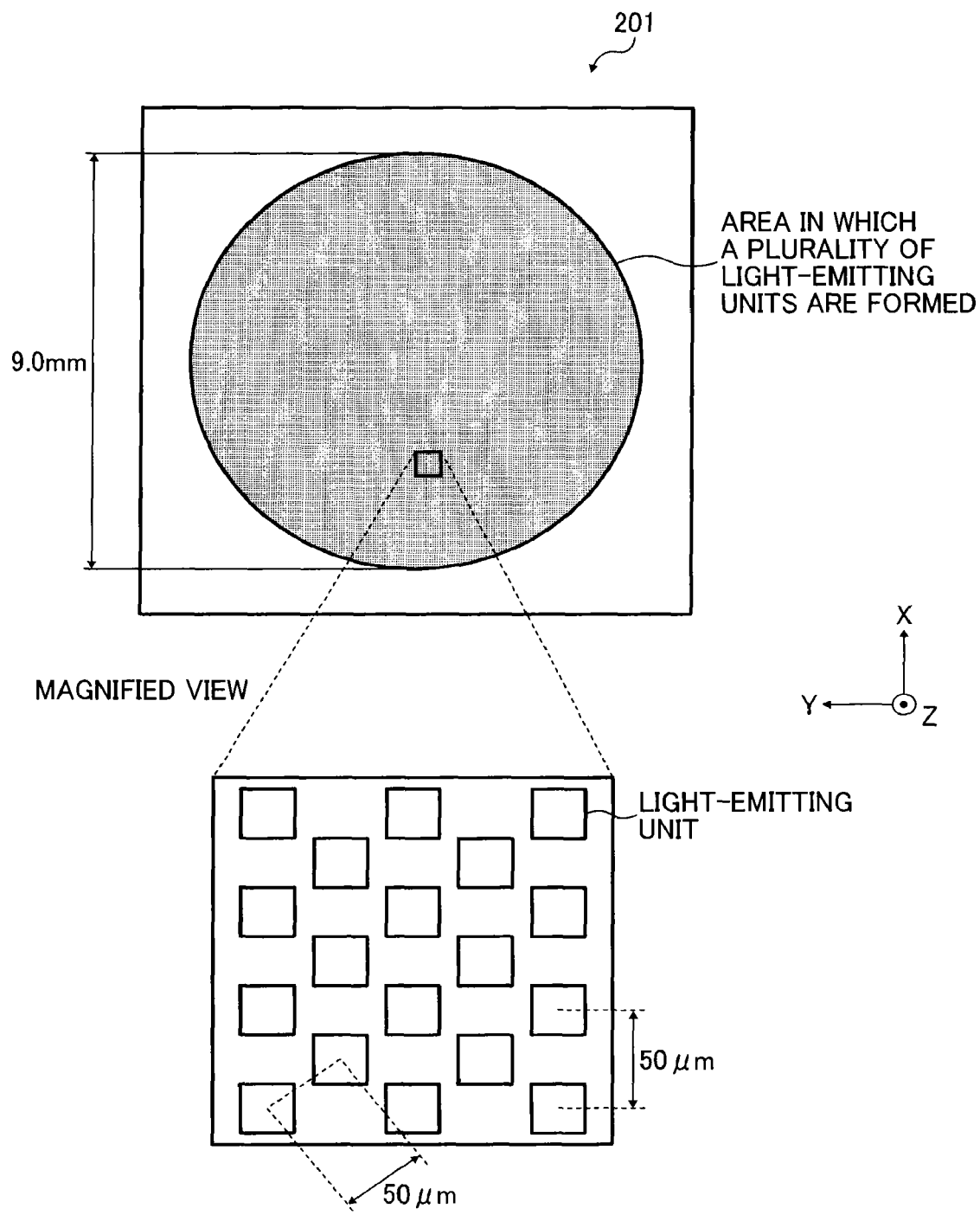
FIG. 4 illustrates a surface emitting laser array according to an embodiment of the present invention.

In the present embodiment, these multiple light-emitting units of the surface emitting laser array 201 are hexagonally packed in an area having 9.0 mm diameter in such a manner that the space among the neighboring light-emitting units is 50 micrometer (μm) (see FIG. 4). When the surface emitting laser array 201 emits light, the multiple light-emitting units emit light at the same time. Moreover, the wavelength of the light that is emitted from the surface emitting laser array 201 is 808 nanometer (nm).

Figure 5:
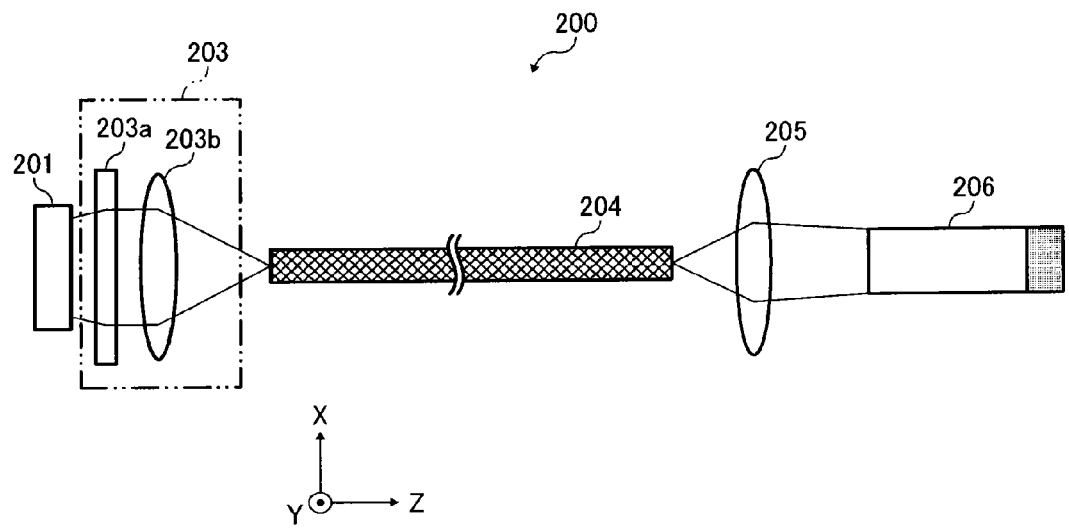
FIG. 5 is diagram illustrating a first condensing optical system according to an embodiment of the present invention.

As illustrated in FIG. 5 for example, the first condensing optical system 203 includes a microlens array 203a and a condenser lens system 203b.

The microlens array 203a is disposed in the optical path of the light emitted from the surface emitting laser array 201. The microlens array 203a includes a plurality of lens units that correspond to the light-emitting units of the surface emitting laser array 201. The lens units of the microlens array 203a approximately collimates the light emitted from the corresponding light-emitting units of the surface emitting laser array 201. In other words, the microlens array 203a collimates the light emitted from the surface emitting laser array 201.

The distance between the surface emitting laser array 201 and the microlens array 203a in the Z-axis direction is determined according to the focal length of the microlens array 203a.

The condenser lens system 203b collects and condenses the light that has passed through the microlens array 203a. The condenser lens system 203b is appropriately selected according to the cross-sectional area of the light that has passed through the microlens array 203a, and the core diameter and numerical aperture (NA) of the optical fiber 204. In the present embodiment, a condenser lens having 8 mm focal length and 10 mm effective diameter is used as the condenser lens system 203b. The condenser lens system 203b may include a plurality of optical elements.

In the present embodiment, a condenser lens having 6 mm focal length is used as the second condensing optical system 205. Note also that the second condensing optical system 205 may include a plurality of optical elements.

Figure 6:
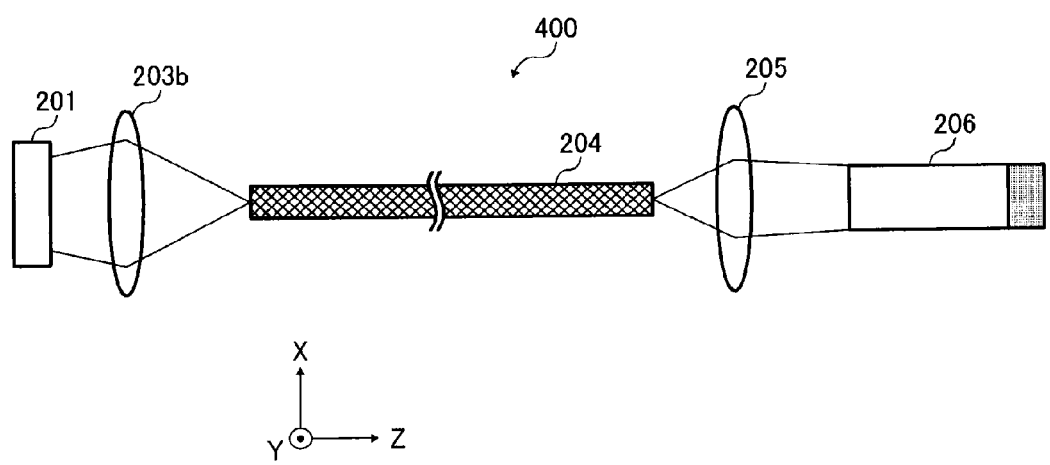
FIG. 6 is a diagram illustrating a control sample of a laser device.

FIG. 6 illustrates a laser device 400 as a control sample of the laser device 200 of the embodiment described above. The laser device 400 illustrated in FIG. 6 is equivalent to the laser device 200 from which the microlens array 203a is removed.

Figure 7A:
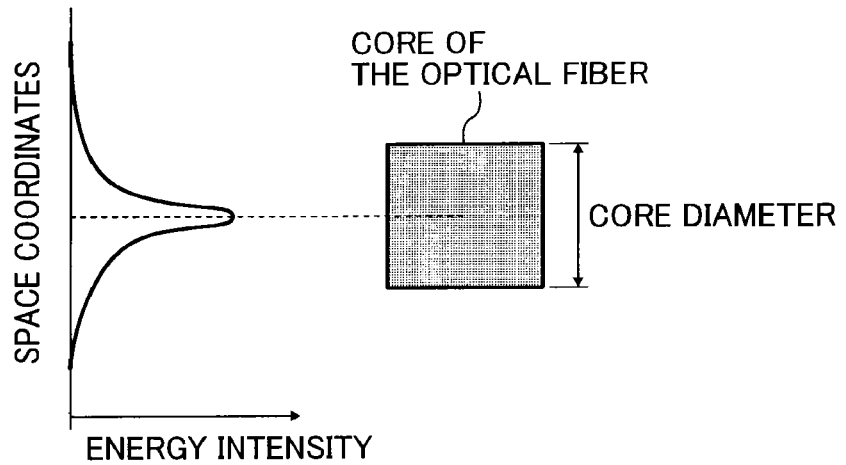
FIG. 7A is a diagram illustrating the spatial energy distribution of the light that enters an optical fiber in a laser device 200 according to an embodiment of the present invention.
Figure 7B:
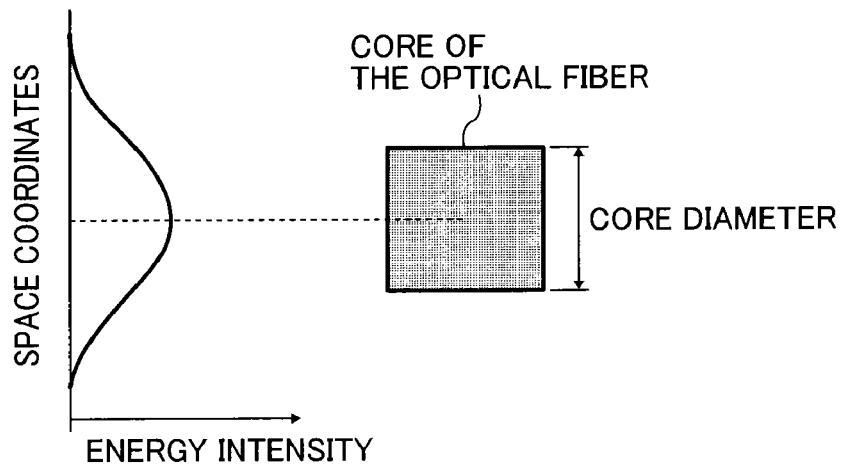
FIG. 7B is a diagram illustrating the spatial energy distribution of the light that enters an optical fiber in a laser device 400 according to an embodiment of the present invention.

FIG. 7A illustrates the spatial energy distribution of the light that enters the optical fiber 204 in the laser device 200. FIG. 7B illustrates the spatial energy distribution of the light that enters the optical fiber 204 in the laser device 400.

In the laser device 200, the light that enters the condenser lens system 203b is approximately collimated by the microlens array 203a. Accordingly, compared with the laser device 400, optical energy in the laser device 200 is collected and condensed by the condenser lens system 203b such that the optical energy is more concentrated to the center of the optical fiber 204.

When the spatial energy distribution of the light that enters the optical fiber 204 differs, the beam quality (M2 value) of the light that is emitted from the optical fiber 204 varies. More specifically, the M2 value is smaller in the laser device 200 than in the laser device 400. In other words, the beam quality is superior in the laser device 200. By contrast, when the light that is emitted from a surface emitting laser array is directly collected and condensed by a condenser lens, the condensed light has relatively even spatial intensity distribution in a radial direction. When light with such intensity distribution enters an optical fiber, the beam quality of the light exiting from the other side of the optical fiber becomes poor (the M2 value is large).

Figure 8A:
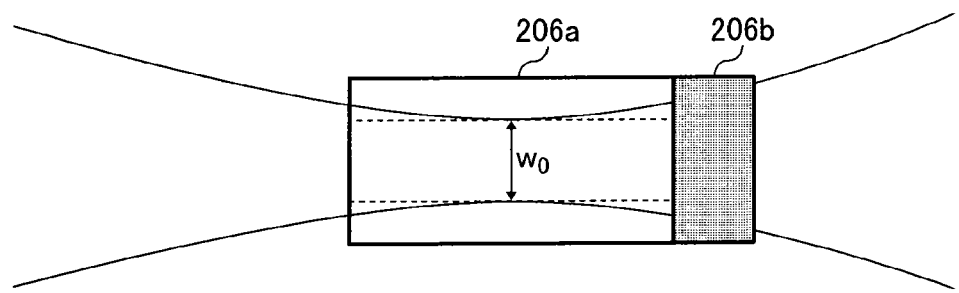
FIG. 8A is a schematic diagram illustrating the light that enters a laser resonator in a laser device 200 according to an embodiment of the present invention.
Figure 8B:
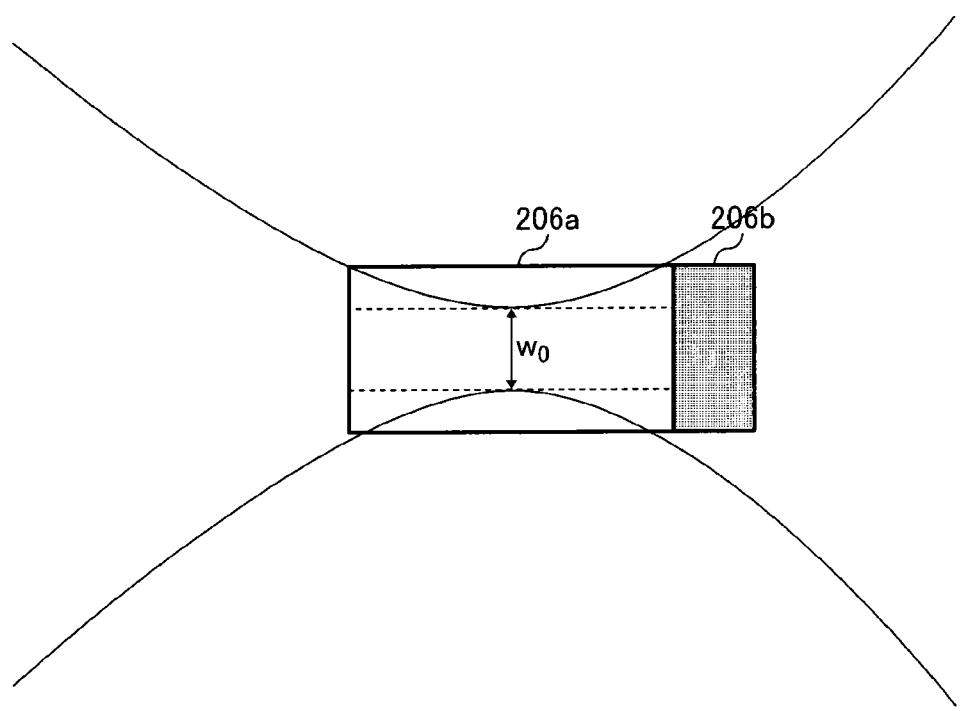
FIG. 8B is a schematic diagram illustrating the light that enters a laser resonator in a laser device 400 according to an embodiment of the present invention.

FIG. 8A is a schematic diagram of the light that enters the laser resonator 206 in the laser device 200. FIG. 8B is a schematic diagram of the light that enters the laser resonator 206 in the laser device 400. In the following description, the light that has entered the laser resonator 206 may be referred to as pump light.

The M2 value is a parameter indicating the beam quality of light and the expansion of light at the front end and rear end of the beam waist w0. In the laser device 400, the M2 value is large. Accordingly, as illustrated in FIG. 8B, the beam diameter widely expands before and after the beam waist w0.

Note that the region within the beam waist w0 (inside the broken line in FIG. 8A and FIG. 8B) in the laser resonator 206 is most strongly pumped, and this region mostly contributes to the oscillation of a Q-switched laser. The light that enters the outside of the beam waist is all dissipated, and is converted into heat.

For this reason, the excitation efficiency of the laser resonator 206 in the laser device 400 is very low compared with the laser device 200, and a pump source with very large output power is required for achieving desired Q-switched laser characteristics. Further, the properties of the laser resonator 206 fluctuates due to the influence of heat in the laser device 400, and desired Q-switched laser characteristics cannot be achieved in a stable manner.

On the other hand, as illustrated in FIG. 8A, the expansion of the beam diameter before and after the beam waist w0 in the laser device 200 is small as the M2 value is small.

Accordingly, the ratio of optical loss is reduced in the laser device 200, and the excitation efficiency significantly improves. Further, the properties of the laser resonator 206 are stable as the heat generation is relatively low. As a result, desired Q-switched laser characteristics can be obtained in a stable manner.

In the laser device 200 according to the present embodiment, the output of the light exiting from the optical fiber 204 (such an optical output will be referred to as a fiber output) is 180 watts (W) of power, and the M2 value that indicates the beam quality is found to be about 1200. Accordingly, desired Q-switched laser output is obtained from the laser resonator 206.

In order to achieve desired Q-switched laser output, the laser resonator 206 needs to be pumped in an efficient manner. In order to pump the laser resonator 206 in an efficient manner, (1) the output power of the pump light needs to be large, and (2) the beam quality needs to be sufficient (i.e., the M2 value needs to be small).

In order to satisfy both of the above two characteristics, the combinations of the following characteristics were studied. That is, the combinations of the shape of an area of the surface emitting laser array 201 in which a plurality of light-emitting units are formed, the presence of the microlens array 203a, and the core diameter of the optical fiber 204 were studied. In the following description, an area of the surface emitting laser array 201 in which a plurality of light-emitting units are formed will be referred to as a light-emitting unit area for the purposes of simplification.

In order to obtain pump light with large output power, a light-emitting unit area may be enlarged. Then, in order to carry the light from such an enlarged light-emitting unit area to the laser resonator 206, the core diameter of the optical fiber 204 needs to be enlarged.

However, the M2 value of the light exiting from the optical fiber 204 is determined by the core diameter of the optical fiber 204, and the M2 value of the exiting light increases as the core diameter of the optical fiber 204 is larger. When the M2 value is too great, it becomes difficult to pump the laser resonator 206 in an efficient manner, and desired Q-switched laser output cannot be obtained in some cases even with pump light with large output power.

FIG. 9 is a table of experimental results indicating the output of a Q-switched laser where, for example, the size and shape of a light-emitting unit area, and the core diameter of an optical fiber are varied. Note that in the evaluation of the Q-switched laser output, "o" indicates that desired Q-switched laser output was successfully obtained, and "x" indicates that desired Q-switched laser output was not obtained.

According to the various types of experimental results described above, it is found that both of the above two characteristics is satisfied in the present embodiment when (1) a light-emitting unit area is shaped like a circle with the diameter of 7.0 mm or greater or shaped like a regular polygon with six or more angles and (2) the core diameter of the optical fiber 204 is equal to or greater than 1.0 mm and less than 2.0 mm. Note that it is desired the microlens array 203a be provided, the fiber output be equal to or greater than 120 W of power, and the M2 value of the light that is emitted from the optical fiber 204 be equal to or less than 1200.

As described above, the microlens array 203a and the condenser lens system 203b together serve as "an optical system disposed in an optical path of light that is emitted from the surface emitting laser" in the laser device 200 according to the present embodiment of the present invention. Moreover, the microlens array 203a serves as a first optical element, and the condenser lens system 203b serves as a second optical element.

The second condensing optical system 205 serves as "at least one optical element disposed in an optical path between the transmission member and the laser resonator" in a laser device according to an embodiment of the present invention, and the optical fiber 204 serves as a transmission member.

In the ignition system 301 according to the present embodiment, the emission optical system 210 serves as an optical system in an ignition system according to an embodiment of the present invention.

As described above, the laser device 200 according to the present embodiment includes the surface emitting laser array 201, the first condensing optical system 203, the optical fiber 204, the second condensing optical system 205, and the laser resonator 206.

The surface emitting laser array 201 includes a plurality of light-emitting units. The first condensing optical system 203 includes the microlens array 203a and the condenser lens system 203b. The microlens array 203a includes a plurality of lens units that correspond to the light-emitting units of the surface emitting laser array 201. The lens units of the microlens array 203a collimate the light emitted from the corresponding light-emitting units of the surface emitting laser array 201.

The laser resonator 206 is a composite crystal of the laser medium 206a and the saturable absorber 206b.

In such cases, optical energy is collected and condensed by the condenser lens system 203b such that the optical energy is concentrated close to the center of the optical fiber 204. The light that enters the laser resonator 206 has a small M2 value. Accordingly, the ratio of optical loss is reduced at the laser resonator 206, and the excitation efficiency significantly improves. That is, high excitation efficiency can be achieved with the laser device 200 according to the present embodiment. Further, the properties of the laser resonator 206 become stable, and as a result, desired Q-switched laser characteristics can be obtained in a stable manner.

In the present embodiment, the light that is emitted from the surface emitting laser array 201 is transmitted to the laser resonator 206 by the optical fiber 204. In such configuration, the surface emitting laser array 201 may be disposed at a position distant from the combustion chamber 304. Accordingly, the reliability of the surface emitting laser array 201 can be secured.

The light that is emitted from the optical fiber 204 is collected and condensed by the second condensing optical system 205, and enters the laser resonator 206. By so doing, even with a narrow cross-sectional area of the laser resonator 206, the light that is emitted from the optical fiber 204 can efficiently be transmitted to the laser resonator 206.

Due to the provision of the laser device 200, the ignition system 301 according to the present embodiment can perform ignition in an efficient and stable manner.

Moreover, due to the provision of the ignition system 301, the operation of the engine 300 according to the present embodiment can be performed in an efficient and stable manner.

In the example embodiments described above, cases in which the a light-emitting unit area is shaped like a circle with the diameter of 9.0 mm and the core diameter of the optical fiber 204 is 1.5 mm were described. However, no limitation is indicated thereby. It is satisfactory as long as a light-emitting unit area is shaped like a circle with the diameter of 7.0 mm or greater or shaped like a regular polygon with six or more angles and the core diameter of the optical fiber 204 is equal to or greater than 1.0 mm and less than 2.0 mm.

In the embodiments described above, cases in which the output of the light exiting from the optical fiber 204 (fiber output) is 180 W of power, and the M2 value that indicates the beam quality is about 1200 are described. However, no limitation is intended thereby. Note that it is desired the fiber output be equal to or greater than 120 W of power and the M2 value be equal to or less than 1200.

In the laser device 200, a surface emitting laser having a single light-emitting unit may be used in place of the surface emitting laser array 201.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A laser device, comprising:
   a surface emitting laser array configured to emit light;
   an optical system disposed in an optical path of light that is emitted from the surface emitting laser, the optical system including
      a first optical element configured to collimate the light emitted from the surface emitting laser, and
      a second optical element configured to collect and condense the light collimated by the first optical element;
   a laser resonator which the light passed through the optical system enters; and
   a transmission member configured to transmit light from the second optical element to the laser resonator.

2. The laser device according to claim 1, wherein
   the surface emitting laser includes a plurality of light emitters, and
   the first optical element is a microlens array including a plurality of lenses that correspond to the plurality of light emitters of the surface emitting laser.

3. The laser device according to claim 1, wherein the laser resonator is a Q-switched laser.

4. The laser device according to claim 3, wherein the laser resonator includes a laser medium and a saturable absorber.

5. The laser device according to claim 4, wherein
   the laser medium is a YAG crystal where Nd is doped, and
   the saturable absorber is a YAG crystal where Cr is doped.

6. The laser device according to claim 4, wherein the laser resonator is a composite crystal.

7. The laser device according to claim 1, wherein the laser resonator is made of ceramic.

8. The laser device according to claim 1, further comprising:
   at least one optical element disposed in an optical path between the transmission member and the laser resonator.

9. The laser device according to claim 1, wherein the transmission member is an optical fiber.

10. The laser device according to claim 9, wherein a diameter of a core of the optical fiber is equal to or greater than 1.0 mm and less than 2.0 mm.

11. The laser device according to claim 9, wherein a fiber output of the optical fiber is equal to or greater than 120 watts.

12. The laser device according to claim 9, wherein an M2 value of light exiting from the optical fiber is equal to or less than 1200.

13. The laser device according to claim 1, wherein
   the surface emitting laser includes a plurality of light emitters, and
   an area in which the plurality of light emitters are formed is shaped like a circle or a regular polygon with six or more angles.

14. An ignition system, comprising:
   the laser device according to claim 1; and
   a second optical system configured to collect and condense light emitted from the laser device.

15. An internal combustion engine, comprising:
   the ignition system according to claim 14, wherein
   the ignition system is configured to ignite fuel to produce inflammable gas.

* * * * *